United States Patent [19]
Kohl et al.

[11] Patent Number: 5,736,898
[45] Date of Patent: Apr. 7, 1998

[54] PROCESS AND DEVICE FOR LINEARIZING THE GAIN CHARACTRISTICS AND PHASE-FREQUENCY CHARACTERISTICS OF TRAVELING-WAVE TUBES AND TRANSISTOR AMPLIFIERS AT DIFFERENT POWER LEVELS

[75] Inventors: Rudolf Kohl, Steinhöring; Gerhard Eggers, Bruckmühl, both of Germany

[73] Assignee: Daimler-Benz Aerospace AG, Ottobrun, Germany

[21] Appl. No.: 691,882

[22] Filed: Aug. 1, 1996

[30] Foreign Application Priority Data

Aug. 4, 1995 [DE] Germany ............... 195 28 844.0

[51] Int. Cl.⁶ ............................................. H03F 1/32
[52] U.S. Cl. ............................. 330/149; 330/124 R
[58] Field of Search ............... 330/43, 53, 124 R, 330/149; 333/14

[56] References Cited

U.S. PATENT DOCUMENTS 4,878,030  10/1989  Vincze ................................. 330/149
5,291,148   3/1994  Reisner et al. ...................... 330/149

OTHER PUBLICATIONS

J. Maynard, et al. May 1994 Fully MMIC Ku–Band and C–Band CAMP/Linearizers for TWTAs Proceedings of the SPACE TWTAs 1994 Workshop ESA WPP–072.

A. J. Khilla May 1994 Linearization of Power Amplifiers for Satellite Application Proceedings of the SPACE TWTAs 1994 Workshop ESA WPP–072.

A. Berman et al., 1992, Linearized Microwave Amplifiers, 14th International Communications Satellite Systems Conference, Washington, DC, AIAA–92–1864–CP.

G. Satoh, Oct. 1979 (1981), Linearizer for High–Power Traveling Wave Tube Amplifier, Electronics and Communications in Japan, vol. 62, p. 72.80.

S. S. Moochalla, et al., 1992, A Integrated Ku–Ban Linearizer Driver Amplifier for TWTA's with High Grain and Wide Bandwidth, 14th International Communications Satellite Systems Conference, Washington, Dc, AIAA–92–1825–CP.

*Primary Examiner*—Steven Mottola
*Attorney, Agent, or Firm*—McGlew and Tuttle

[57] ABSTRACT

A process for linearizing the gain and phase-frequency characteristics of traveling-wave tubes and transistor amplifiers at different power levels is suggested, wherein the signal is divided between two branches and again united into the output signal, and in which the signal is divided between partial networks with compressing gain behavior, which are placed between two 3-dB couplers, and gain compression or gain expansion of the partial signals (E or K) is generated at two gates (KOMP, EXP) by the reflection behavior, which is different corresponding to the signal level, and the level of the nonlinear, gain-expanded partial signal (E) is raised by a linear amplifier (E2), and the additionally amplified, gain-expanded signal (E2) and the gain-compressed signal (K) are then united into the output signal with an adding network.

8 Claims, 2 Drawing Sheets

COUPLING NETWORK

PROCESS AND DEVICE FOR LINEARIZING THE GAIN CHARACTRISTICS AND PHASE-FREQUENCY CHARACTERISTICS OF TRAVELING-WAVE TUBES AND TRANSISTOR AMPLIFIERS AT DIFFERENT POWER LEVELS

FIELD OF THE INVENTION

The present invention pertains to a system for linearizing the gain characteristics and phase-frequency characteristics of traveling-wave tubes and transistor amplifiers at different power levels, wherein the signal is divided into two branches and is again united into an output signal, and to a process for operating this system.

BACKGROUND OF THE INVENTION

Traveling-wave tubes and transistor amplifiers display a change in gain and in phase with increasing level of the input signal. To compensate this change and to obtain a possibly linear gain and linear phase up to the maximum power output, linearizers are used as pre-distorters for correcting this behavior.

Many linearizers share the feature of having a nonlinear branch as well as at least one other linear or nonlinear branch. Such linearizers described in, e.g..
J. Maynard, B. Cogo, M. Pouysegur: Fully MMIC Ku-Band and C-Band CAMP/Linearizers for TWTAs, *Proceedings of the SPACE TWTAs 1994 Workshop ESA WPP-072*, May 1994,
A. M. Khilla: Linearization of Power Amplifiers for Satellite Application, *Proceedings of the SPACE TWTAs 1994 Workshop ESA WPP-072*, May 1994,
A. Berman et al.: Linearized Microwave Amplifiers, *14th International Communications Satellite Systems Conference*, Washington, DC, AIAA-92-1864-CP, and
G. Satoh: Linearizer for High-Power Traveling Wave Tube Amplifier, *Electronics and Communications in Japan*, Vol. 62, Oct. 1979 (1981), p. 72.80.

Other concepts use a field-effect transistor (FET), in which the signal is sent from the source terminal to the drain terminal, wherein the nonlinear behavior of the FET is used for linearization. Such a linearizer is described in:
S. S. Moochalla, A. Katz, et al.: An Integrated Ku-Band Linearizer Driver Amplifier for TWTA's with High Gain and Wide Bandwidth, *14th International Communications Satellite Systems Conference*, Washington, DC, AIAA-92-1825-CP.

SUMMARY AND OBJECTS OF THE INVENTION

The object of the present invention is to provide a process and a device of the type described in the introduction, which achieve at least just as great changes in gain and phase as the prior-art processes and devices with a greatly reduced circuit complexity.

According the invention, a process is provided for linearizing the gain and phase frequency characteristics of travelling wave tubes and transistor amplifiers at different power levels. The signal is divided into two branches and again united into an output signal. In dividing the signal, the signal is divided between two identical nonlinear partial circuits with compressing gain behavior. The circuits are placed between two 3-dB couplers. Gain compression or gain expansion of the partial signals (E or K) is generated at two gates (KOMP, EXP) by the reflection behavior, which differs corresponding to the signal level. The level of the nonlinear, gain-expanding partial signal (E) is raised by a linear amplifier (E2). The additionally amplified, gain-expanded signal (E2) and the gain compress signal (K) are united into the output signal with an adding circuit.

According to a further feature of the invention, a device is provided for carrying out the process above, including two identical, nonlinear partial circuits (networks) each with compressing gain behavior. The nonlinear partial circuits are placed between two 3-dB couplers. A linear amplifier is provided for raising the level of one partial signal (E), and an adding circuit is provided for uniting the partial signal (E2) amplified as a result with the other signal (K) into the output signal.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

Figure 2A:
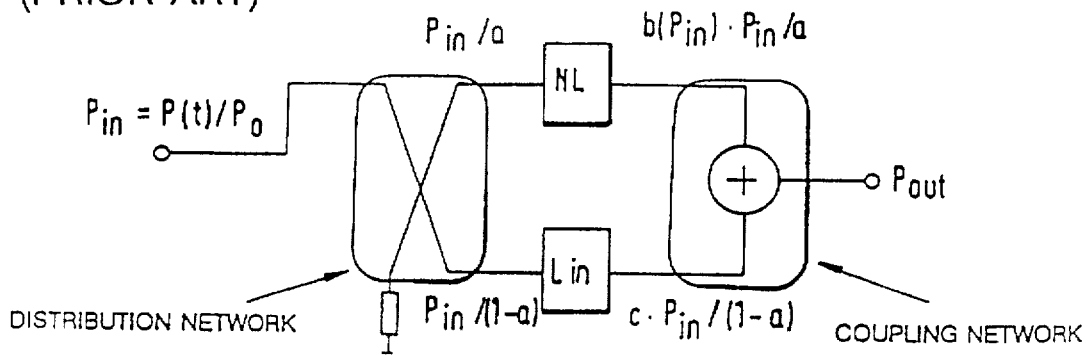
FIGS. 2a–c are three exemplary embodiments according to the state of the art.
Figure 2B:
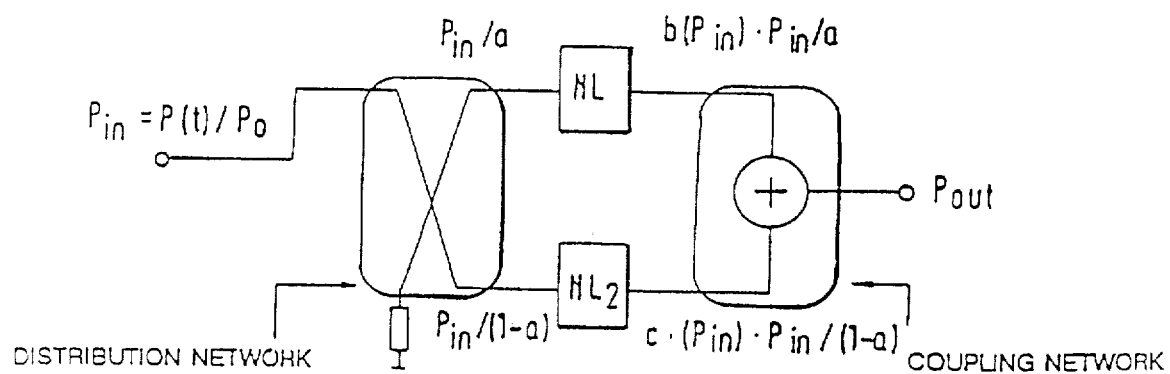
Figure 2C:
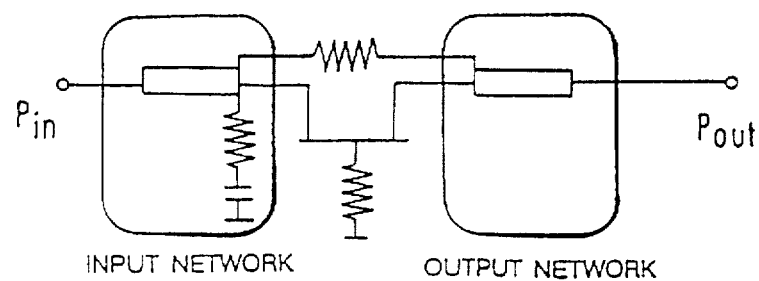

The state of the art will first be briefly explained based on FIG. 2a–2c.

FIG. 2a shows a linearizer with a nonlinear branch and a linear branch. The signal $P_{in}=P(t)/P_0$ is divided between the branches at a defined coupling coefficient a. Now, $0 \leq P(t) \leq P_0$. The value and the phase of one partial signal $P_{in}/a$ is changed in the nonlinear branch NL by means of nonlinear components, e.g., phase shifters, an amplifier operated near saturation, diode networks or the like, so that the signal $b(P_{in}) \cdot P_{in}/a$ is obtained. Here, $b(P_{in})$ is a nonlinear function that depends on the input power. The second partial signal $P_{in}/(1-a)$ is processed into the signal $c \cdot P_{in}/(1-a)$ in the linear branch Lin by means of linear components, e.g., phase adjusters, amplifiers, attenuators or the like. Here, c is a constant. The two partial signals are then united into the desired output signal $P_{out}$ with coupling networks.

FIG. 2b shows a likewise prior-art linearizer with two nonlinear branches. The linear components Lin are replaced with nonlinear components $NL_2$, which amplify the signal $P_{in}/(1-a)$ into the signal $c(P_{in}) \cdot P_{in}/(1-a)$. Here, $c(P_{in})$ is likewise a nonlinear function that depends on the intrinsic power. The advantage of the two nonlinear branches is that the changes in gain and phase are markedly greater than in the version according to FIG. 2a. However, this advantage is achieved at the expense of increased circuit complexity. In addition, the compensation effort increases drastically, because two different circuit parts NL and NL2 must be exactly tuned to one another, and because these nonlinear elements usually have different reflection factors over a rather broad frequency range. These reflection factors retroact to the input and thus limit the band width.

According to FIG. 2c, other linearizer designs use a field-effect transistor (FET), in which the signal is sent from the source terminal to the drain terminal, wherein the nonlinear behavior of the FET is used for linearization. The FET is adjusted in the desired frequency range by means of the input and output networks.

DESCRIPTION OF THE PREFERRED EMBODIMENTS

Figure 1:
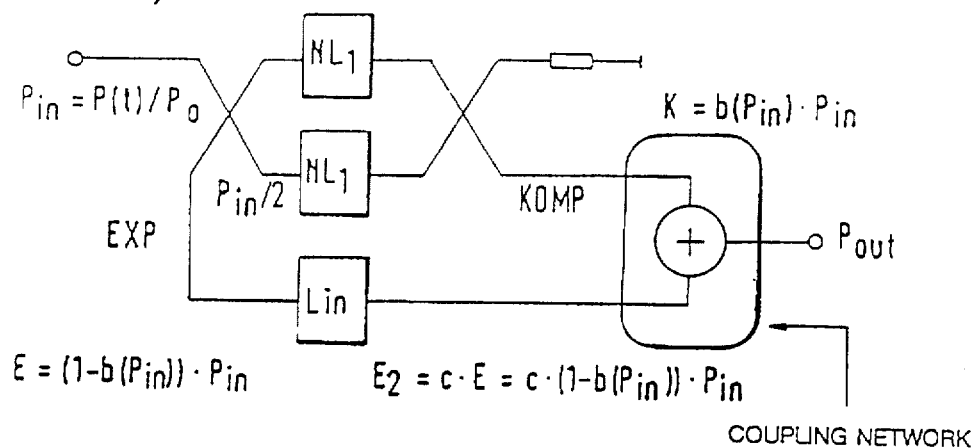
FIG. 1 is a schematic view showing the design of a linearizer according to the present invention.

FIG. 1 shows the subject of the present invention. The input signal $P_{in}=P(t)/P_o$ enters a nonlinear network (network of electrical circuitry) of a balanced design. This circuitry comprises two identical, nonlinear partial circuit networks. Each partial circuit network NL, is designed with diode or transistor elements, which are placed between two 3-dB couplers 1, 2. These partial networks have a compressing gain behavior. At low levels of the input signal, the compressing balancing network allows the greatest part of the power to pass as a signal $K=b(Pin) \cdot P_{in}$ through the KOMP gate, while a small part is reflected and reaches the EXP gate. A large portion is reflected to EXP and a small portion is passed through to KOMP at high input signal levels.

Thus, the partial signal K at KOMP displays a gain-compressing behavior and the partial signal E at EXP displays a gain-expanding behavior. Both signals fail to show phase changes over the dynamics of the system.

The level of the nonlinear partial signal, $E=(1-b(P_{in})) \cdot P_{in}$, is raised to $E2=c \cdot E=c \cdot (1-b(P_{in})) \cdot P_{in}$ by a linear amplifier, which is formed, e.g., by a discrete FET stage or a monolithically integrated circuit (MMIC). The two nonlinear partial signals K and E2 are united into the desired output signal $P_{out}$ in an adding network, e.g., a coupler. The output signal has an expanding gain behavior with optionally positive or negative phase change. The slope of the changes in gain and phase can be set by changing the gain of the linear amplifier Lin.

The advantage over the prior-art solutions is, e.g., the fact that two nonlinear partial signals K and E are generated with a reduced circuit complexity with only one balanced compressor circuit. It is thus possible to reach just as great changes in gain and phase as in the case of the prior-art solution, but at a greatly reduced circuit complexity.

In addition, the solution according to the present invention guarantees good adjustment up to a band width of 1 to 2 octaves. TWTAs and transistor amplifiers with band widths of 30% or more can thus be compensated with a single linearizing element. The structure is planar and thus it can be realized in a simple manner. No compensation of the expander and compressor paths with respect to the common inset point of the nonlinear behavior is necessary. A shift of the inset point toward higher levels can be performed by a DC setting of the operating point of the nonlinear element (transistor, diode). The common inset point is also guaranteed over the temperature range. The small number of components makes possible manufacture at a low cost. The concept is not limited to special frequency bands and it can also be used for other gain and phase corrections, i.e., not only in TWTAs and transistor amplifiers.

In another embodiment, the nonlinear circuit components $NL_1$ themselves have an expanding gain behavior. The transmitted partial signal E has an expanding character, and the reflected partial signal K has a compressing gain behavior. The partial signals E and K are united into the output signal as described in this case as well.

While specific embodiments of the invention have been shown and described in detail to illustrate the application of the principles of the invention, it will be understood that the invention may be embodied otherwise without departing from such principles.

What is claimed is:

1. A process for linearizing different power level signal gain and phase-frequency characteristics of traveling-wave tubes and transistor amplifiers, the process comprising the steps of:

dividing the signal into two branches to generate two partial signals, each branch being connected to one of two identical nonlinear partial circuit networks with compressing gain behavior, each network being placed between two 3-dB couplers;

providing two gates (KOMP, EXP) connected to said networks and generating a gain compressed partial signal (K) and an expanded partial signal (E) at said two gates (KOMP, EXP) by reflection behavior, said compressed and expanded partial signals differing corresponding to the signal level;

raising the level of the nonlinear, gain-expanding partial signal (E) by a linear amplifier to form an additionally amplified, gain-expanded signal (E2); and uniting the additionally amplified, gain-expanded signal (E2) and the gain-compressed signal (K) into an output signal with an adding network.

2. A device for linearizing different power level signal gain and phase-frequency characteristics of traveling-wave tube amplifiers and transistor amplifiers, the device comprising:

a first nonlinear partial circuit network with compressing gain behavior;

a second nonlinear partial circuit network with compressing gain behavior, said second nonlinear partial circuit network being substantially identical to said first nonlinear partial circuit network, each network being placed between two 3-dB couplers;

means dividing the signal into two branches to generate two partial signals, each branch being connected to one of said first and second partial circuit networks;

Signal gates (KOMP, EXP) connected to said networks and generating a gain compressed partial signal (K) and an expanded partial signal (E) by reflection behavior, said compressed and expanded partial signals differing corresponding to the signal level;

linear amplifier means for raising the level of the nonlinear, gain-expanding partial signal (E) to form an additionally amplified, gain-expanded signal (E2); and an adding circuit network for uniting the additionally amplified, gain-expanded signal (E2) and the gain-compressed signal (K) into an output signal.

3. A process for linearizing gain and phase of a signal processed by traveling-wave tubes and transistor amplifiers, the process comprising the steps of:

dividing the signal into first and second partial signals with a first coupler;

separately processing said first and second partial signals in separate substantially identical nonlinear partial circuit networks with compressing gain behavior;

combining said first and second partial signals from said separate substantially identical nonlinear partial circuit networks in a second coupler to form a gain-compressed partial signal (K);

generating a gain-expanded partial signal (E) at said first coupler;

linearly amplifying a level of said nonlinear, gain-expanded partial signal (E) to form an additionally amplified, gain-expanded signal (E2);

adding said additionally amplified, gain-expanded signal (E2) and said gain-compressed partial signal (K) to form an output signal.

4. A process in accordance with claim 3, wherein:

said first and second couplers are 3-dB couplers;

said amplifying is performed by a linear amplifier.

5. A process in accordance with claim 3, wherein:

said combining to form said gain-expanded partial signal (E) is performed by reflection behavior.

6. A process in accordance with claim 3, wherein:

said generating of said gain-compressed partial signal (K) is performed by reflection behavior.

7. A process in accordance with claim 3, wherein:

said generating of said gain-compressed partial signal (K) and said combining to form said gain-expanded partial signal (E) is performed by reflection behavior.

8. A process in accordance with claim 7, wherein:

said adding is performed by an adding network.

* * * * *